United States Patent
Hsiao et al.

(10) Patent No.: US 8,546,860 B2
(45) Date of Patent: Oct. 1, 2013

(54) STRESS ENGINEERING TO REDUCE DARK CURRENT OF CMOS IMAGE SENSORS

(75) Inventors: Ru-Shang Hsiao, Jhubei (TW); Nai-Wen Cheng, Tainan (TW); Chung-Te Lin, Tainan (TW); Chien-Hsien Tseng, Hsinchu (TW); Shou-Gwo Wuu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/494,769

(22) Filed: Jun. 12, 2012

(65) Prior Publication Data
US 2012/0248515 A1 Oct. 4, 2012

Related U.S. Application Data

(62) Division of application No. 12/768,063, filed on Apr. 27, 2010, now Pat. No. 8,216,905.

(51) Int. Cl.
*H01L 31/113* (2006.01)
*H01L 31/173* (2006.01)

(52) U.S. Cl.
USPC ............. 257/292; 348/306; 257/E27.133

(58) Field of Classification Search
CPC .............. H04N 3/1568; H01L 21/76224
USPC .............. 257/290, 291, 292, E27.133
See application file for complete search history.

(56) References Cited

U.S. PATENT DOCUMENTS

| 6,281,532 | B1 | 8/2001 | Doyle et al. |
| 7,226,834 | B2 | 6/2007 | Bu et al. |
| 7,534,678 | B2 | 5/2009 | Lee et al. |
| 7,618,857 | B2 | 11/2009 | Leong et al. |
| 2006/0006436 | A1* | 1/2006 | Mouli ............................ 257/290 |
| 2007/0105337 | A1 | 5/2007 | Chen et al. |
| 2008/0026523 | A1* | 1/2008 | Lee et al. ...................... 438/231 |
| 2009/0057735 | A1 | 3/2009 | Beak et al. |
| 2009/0225209 | A1* | 9/2009 | Arakawa ....................... 348/306 |
| 2009/0250733 | A1* | 10/2009 | Adkisson et al. ............. 257/292 |
| 2010/0224766 | A1* | 9/2010 | Tateshita ................... 250/214.1 |

FOREIGN PATENT DOCUMENTS

| CN | 101015064 | 8/2007 |
| KR | 10-2007-0017522 | 2/2007 |
| WO | WO 2005/112127 | 11/2004 |

OTHER PUBLICATIONS

Notice of Decision for Patent in corresponding application No. KR 10-2010-0097454.

* cited by examiner

*Primary Examiner* — Jerome Jackson, Jr.
*Assistant Examiner* — Paul Budd
(74) *Attorney, Agent, or Firm* — Lowe Hauptman & Ham, LLP

(57) ABSTRACT

This disclosure relates to an active pixel cell including a shallow trench isolation (STI) structure. The active pixel cell further includes a photodiode neighboring the STI structure, where a first stress resulted from substrate processing prior to deposition of a pre-metal dielectric layer increases dark current and white cell counts of a photodiode of the active pixel cell. The active pixel cell further includes a transistor, where the transistor controls the operation of the active pixel cell. The active pixel cell further includes a stress layer over the photodiode, the STI structure, and the transistor, and the stress layer has a second stress that counters the first stress exerted on the substrate, and the second stress reduces the dark current and the white cell counts caused by the first stress.

20 Claims, 8 Drawing Sheets

STRESS ENGINEERING TO REDUCE DARK CURRENT OF CMOS IMAGE SENSORS

CLAIM OF PRIORITY

The present application is a divisional application and claims priority of U.S. patent application Ser. No. 12/768,063, entitled "Stress Engineering to Reduce Dark Current of CMOS Image Sensors," filed on Apr. 27, 2010, which is incorporated herein by reference in its entirety.

FIELD

This application relates to complementary metal-oxide-semiconductor (CMOS) image sensors and, more particularly, to reducing dark current of CMOS image sensors.

BACKGROUND

Complementary metal-oxide-semiconductor (CMOS) image sensors (CIS) are gained popularity recently because of the advantages, such as ability of on-chip signal processing, and low cost and low power consumption, compared to other types of image devices. In addition, chip industry's steady march to finer sub-micron nodes, combined with adding more features on a per-pixel basis, continues to push CIS solutions ahead of charge-coupled devices (CCDs). CIS technology makes it possible to integrate imaging, timing, and readout functions all on the same device. CIS technology also enables practical system-on-a-chip solutions that serve an expanding array of display-centric applications.

Dark current is one of the important parameters used to characterize the performance of an image sensor. Dark current (leakage current) is electric current that flow through photosensitive devices, such as photodiodes, when no photons are entering the devices. As the pixel sizes decrease, the amount of photons received by the photodiodes of CIS also decreases. As a result, the effect of dark current becomes more pronounced. Therefore, minimizing dark current is a critical issue for advanced CIS. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENT

Figure 1:
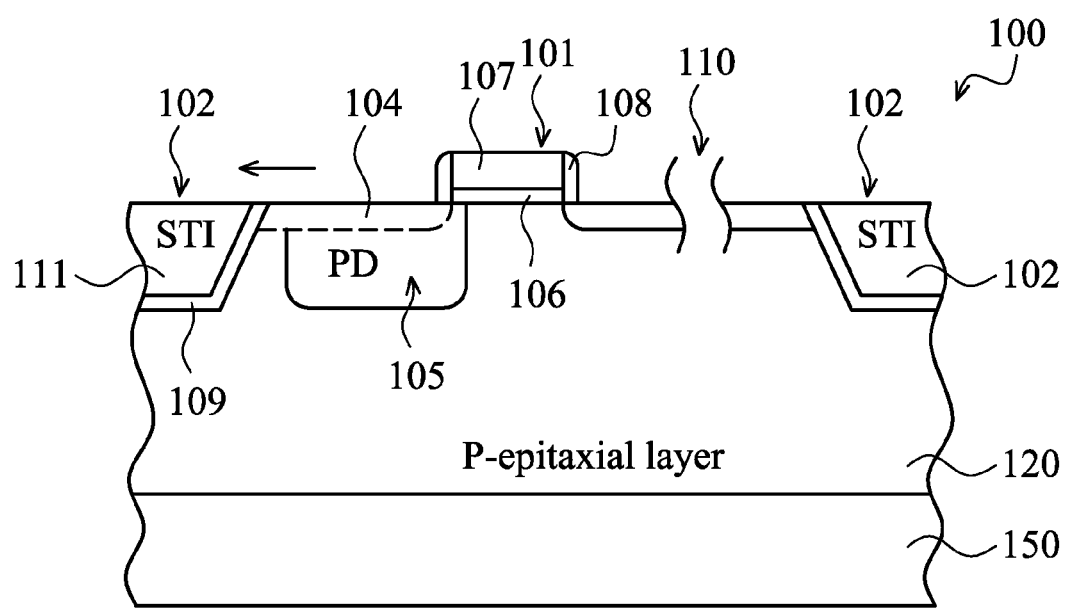
FIG. 1 shows a cross-sectional view of an active pixel cell, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 shows a cross-sectional view of an active pixel cell 100, in accordance with some embodiments. The active pixel cell 100, which is a CIS, has a photodiode 105, a transistor 101, and isolation structures 102. Details of a portion 110 of the pixel cell 100 are not shown. The portion 110 could include one or more transistors, diffusion region(s), and additional isolation structure(s). The active pixel cell 100 could be any type pixel cell, such as 5 T (5 transistors), 4 T, 3 T, or 1 T pixel cell. The transistors, such as 4 transistors for 4 T pixel cell, in the active cell 100 are used to control the operation of the active pixel cell 100. In some embodiments, transistor 101 is an NMOS (n-type metal-oxide-semiconductor) and the photodiode 105 is an n-type photodiode, both of which are created on a P-epitaxial layer 120. The P-epitaxial layer 120 is disposed over a silicon substrate 150. In some embodiments, the photodiode 105 includes a P-type pinning layer 104. The transistor 101 includes a gate dielectric layer 106, a gate layer 107, and spacers 108. Each of the gate dielectric layer 106, the gate layer 107, and the spacers 108 can be made or one or more layers. In some embodiments, the isolation structures 102 are shallow trench isolation (STI) structures, which may include a liner dielectric layer 109 and a gap-fill dielectric layer 111.

In some embodiments, the isolation structures 102 are created before the formation of photodiode 105 and transistor 101. During the creation of the isolation structure 102, stress is introduced to silicon in the silicon substrate 150, or more precisely silicon in the epitaxial layer 120. If the isolation structure 102 is an STI structure, its creation may involve photoresist patterning, silicon etching, dielectric film deposition, etc.

Figure 2:
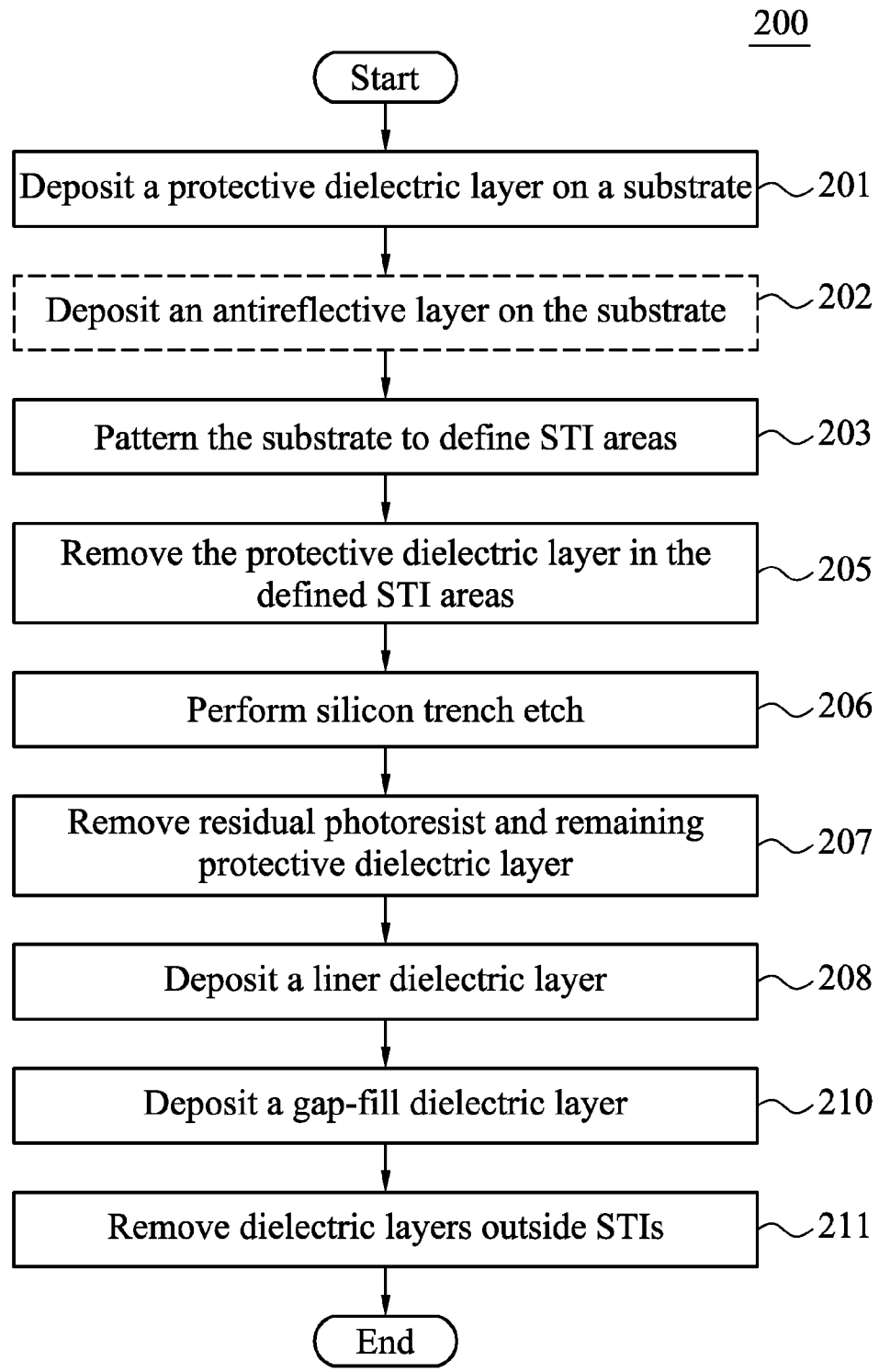
FIG. 2 shows a process flow of preparing an STI structure, in accordance with some embodiments.

FIG. 2 shows a process flow 200 of preparing an STI structure, in accordance with some embodiments. Process flow 200 includes an operation 201 of depositing a protective dielectric layer, which is used to protect silicon surface during trench etch, on the silicon substrate (or more precisely on the epitaxial layer of the silicon substrate). After the deposition of the protective dielectric layer, the substrate is patterned to define areas of STIs at operation 203. The patterning operation includes, but is not limited to, depositing a photoresist layer, and photolithography. In some embodiments, process flow 200 includes an optional operation 202 of depositing an anti-reflective coating (ARC) layer before operation 203. In some embodiments, a silicon oxynitride layer is used as the ARC layer. The ARC layer is deposited to help the lithography of the STI structures, such as STIs 102. After STI pattern is created, the substrate undergoes an etch to remove the protective dielectric layer exposed after patterning at operation 205, which is then followed by a silicon trench (shallow trench) etch to create isolation trenches at operation 206. If an ARC layer is used, operation 205 also includes removing the ARC layer prior to Si trench etch. Following operation 206, the residual photoresist (or post-etch photoresist) and the remaining protective dielectric layer are removed from the substrate at operation 207. If an ARC layer is used, operation 207 includes removing the ARC layer.

After operation 207, a liner dielectric layer is grown to line the shallow isolation trenches (STIs) at operation 208. The liner dielectric layer can be a silicon dioxide layer grown by using an oxygen-containing process gas a high temperature, such as 900-1100° C. In some embodiments, the thickness of the liner layer is between about 25 Å to about 250 Å. The high process temperature and the growth of the liner layer help to repair the damage caused by silicon etch (or shallow trench etch). In some embodiments, after the growth of the liner layer, such as liner dielectric layer 109 of FIG. 1, the substrate undergoes a post-growth anneal at a high temperature, such as 900-1100° C., in an inert environment (also during operation 208). Such a high temperature anneal is used to prevent (or reduce, or repair) silicon crystal defects. Following the oxide growth and post-growth anneal, a dielectric gap-fill layer, such as gap-fill dielectric layer 111 of FIG. 1, is deposited to fill the STIs, at operation 210. In some embodiments, an oxide layer is deposited using a plasma process, such as a high-density plasma (HDP) process.

After operation 210, the dielectric layers, including the gap-fill layer and the liner layer, outside STIs are removed at operation 211. In some embodiments, the excess dielectric layers are removed by chemical-mechanical planarization (CMP) process(es). After the STI structures are created, additional process sequence is performed to create the transistor and the photodiode. For example, the additional processes may include film deposition, photoresist patterning, implant(s), etching, etc.

Figure 3A:
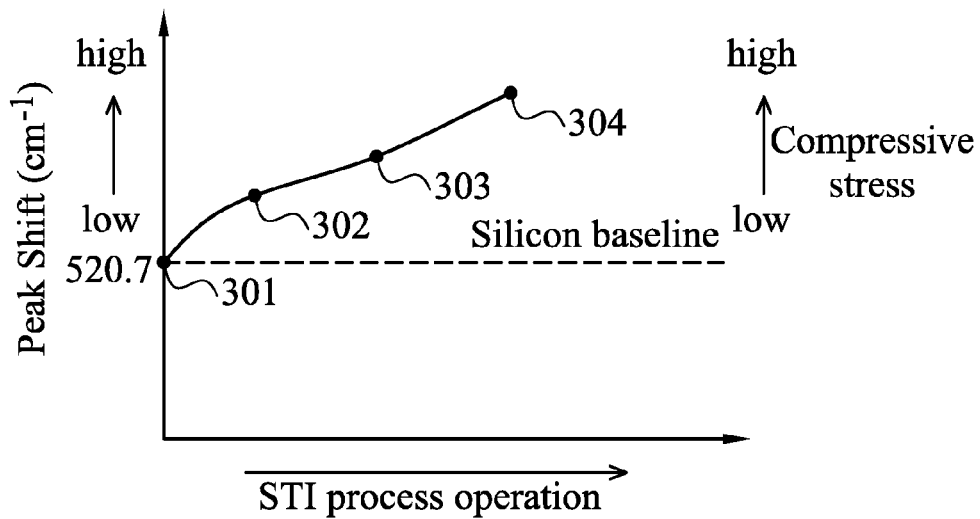
FIG. 3A shows peak shifts at a number of stages of STI creation of a substrate by using Micro-Raman spectroscopy, in accordance with some embodiments.

During the creation of STIs, the silicon substrate (or more precisely the epitaxial layer) undergoes various process operations, which introduce damage and stress to the Si substrate. For example, STI etch (or silicon trench etch) removes silicon from the substrate and introduces damages to the substrate. The growth of oxide liner layer, post-growth annealing and deposing gap-fill oxide to fill the STI would introduce stress to the silicon substrate due to lattice mismatch. FIG. 3A shows peak shifts at a number of stages of STI creation of a substrate by using Micro-Raman spectroscopy, in accordance with some embodiments. The data shows that the Raman peak shift is about 520.7 cm$^{-1}$ before the processing sequence of STI creation (point 301, silicon base). In FIG. 3A, data point 303 is taken on a substrate at an operation after the operation of data point 302. Similarly, the operation of data point 304 is after data point 303. The operations of substrate processing for creating STI, such as the operations described in FIG. 2, result in increasing Raman peak shift (cm$^{-1}$), which indicates a compressive stress being exerted on the substrate.

Figure 3B:
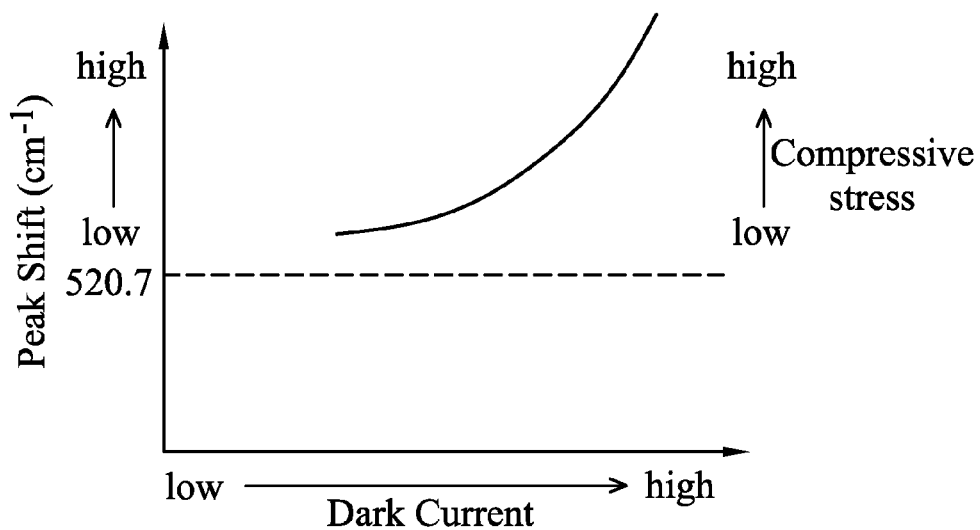
FIG. 3B shows a correlation between Raman peak shift and dark current, in accordance with some embodiments.

As mentioned above, point 301 of FIG. 3A is taken before STI creation. As processing progresses, the compressive stress exerted on the substrate increases. FIG. 3B shows a correlation between Raman peak shift and dark current, in accordance with some embodiments. As Raman peak shift increases, the compressive stress exerted on the substrate increases and results in an increase in dark current, as indicated by curve 311. Curve 311 is only exemplary. The relationship between Raman peak shift and dark current can be linear, or non-linear. Other shapes of curves are also possible, as long as the curves show an increase in Raman peak shift correlating to an increase in dark current.

Figure 3C:
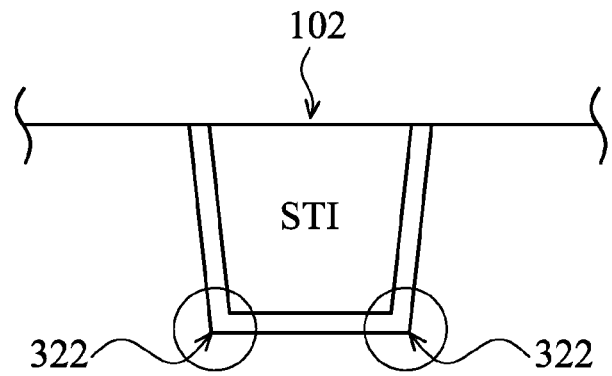
FIG. 3C shows high stress occurring at the lower corners of STI (corners 322), in some embodiments.

As mentioned above, higher Raman peak shift is an indication of higher compressive stress. Stress simulation study of STI structure indicates that very higher stress could occur at the lower corners of STI (corners 322), as shown in FIG. 3C, in some embodiments. FIG. 1 shows that the high stress corner (corner 322) of STI structure 102 is very close to photodiode 105. The compressive stress of STI creation directly affect the neighboring photodiode(s) and leads to increase in dark current. High dark current in photodiodes can make the photodiodes inoperable and become "white (pixel) cell" (or non-functional cell).

Figure 4:
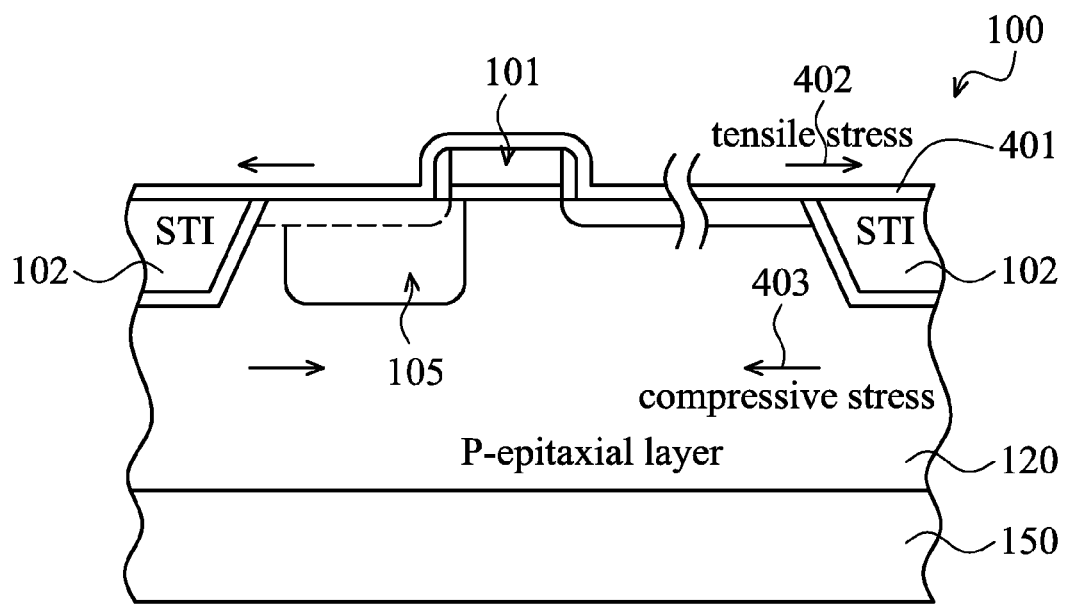
FIG. 4 show a stress layer deposited over devices of an active pixel cell, in accordance with some embodiments.

FIG. 4 show a stress layer 401 deposited over devices of an active pixel cell 100, in accordance with some embodiments. The active pixel cell 100 includes a photodiode 105 disposed between a shallow trench isolation (STI) structures 102 and NMOS transistor 101, which are similar to those in FIG. 1. In some embodiments, the creation of the STI structures, such as STIs 102, exerts a compressive stress 403 on the substrate. Depositing a stress layer 401 on the active pixel cell 100 with a tensile stress 402 to counter the compressive stress 403 exerted by STIs 102 would reduce the occurrence (or magnitude) of dark current in photodiode 105. In some embodiments, the tensile stress 402 of layer 401 should be proportional to the compressive stress 403 exerted by the STIs on the substrate 150. The higher the compressive stress 403, the higher the tensile stress 402 is needed to counter the compressive stress and to reduce dark current.

In addition, the tensile stress exerted by the stress layer 401 on NMOS transistor 101 increases the mobility of the transistor. As a result, depositing the stress layer 401 has an added benefit of improved NMOS transistor mobility, which would make the NMOS transistor faster and improve image lag. The stress layer 401 can be any dielectric film, such as silicon nitride, silicon oxynitride, silicon oxide, etc., is a part of pre-metal dielectric (PMD) layer. Additional dielectric layer(s) can be deposited over the stress layer to complete the formation of the PMD layer.

Table 1 shows the reduction of white cell counts and dark current, and the increase in N-carrier mobility of NMOS when an 1 GPa nitride film is deposited over the active pixel cell, as shown in FIG. 4. The data show that both dark current and white cell counts are reduced by 7% with the deposition of the 1 GPa nitride film over the devices.

TABLE 1

White cell count and dark current reduction with the deposition of a tensile film over the photodiode and transistor(s) of active pixel cell.

| | % of change |
|---|---|
| White Cell Counts | 7% reduction |
| Dark Current | 7% reduction |
| N-carrier mobility of NMOS | 5% increase |

Figure 5A:
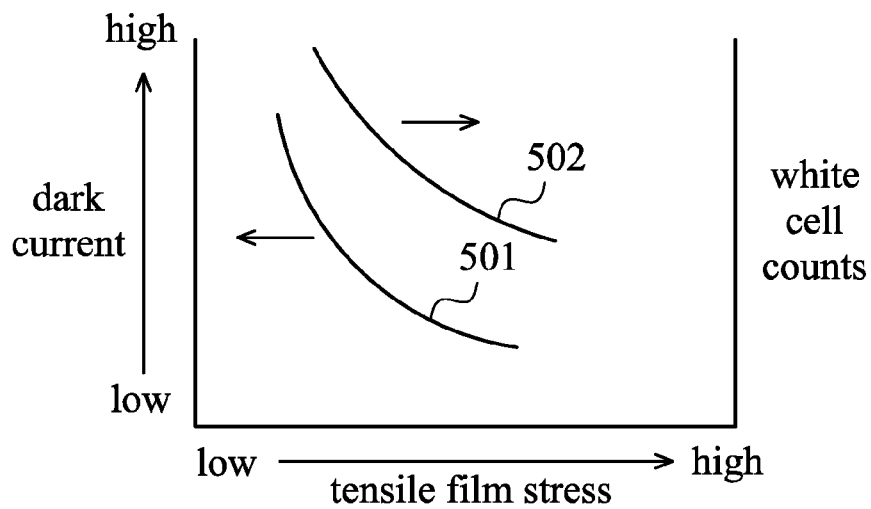
FIG. 5A shows a diagram of dark current and white cell counts as a function of tensile film stress of a stress layer deposited over the active pixel cell, in accordance with some embodiments.

With the deposition of a tensile film, the white cell counts and dark current are reduced. FIG. 5A shows a diagram of dark current and white cell counts as a function of tensile film stress of a stress layer deposited over the active pixel cell, in accordance with some embodiments. Curve 501 shows decreasing dark current with increasing tensile film stress and curve 502 shows decreasing white cell counts with increasing tensile film stress. Curves 501 and 502 are merely examples used to demonstrate increasing tensile film stress helps to reduce dark current and white cell counts. Other shapes of curves are also possible. One thing to note is that the tensile film stress cannot be unlimited increased to a very high value, because high film stress could cause the film and/or the substrate to crack.

As mentioned above, different processes can be used to prepare devices of active pixel cell, and different processes and/or process sequences can be used to prepare STIs, photodiodes, and transistors on the substrate. As mentioned above, Raman spectroscopy can be used to measure the compressive stress exerted on the substrate by STI creation. The higher the peak shift, the higher the compressive stress.

Figure 5B:
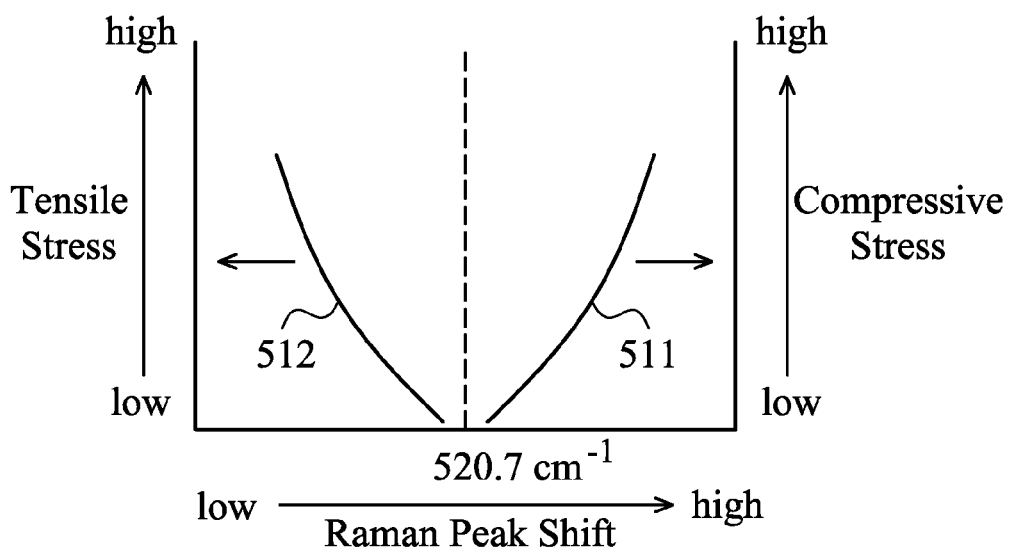
FIG. 5B shows a correlation diagram between film stress and Raman peak shift, in accordance with some embodiments.

FIG. 5B shows a correlation diagram between film stress and Raman peak shift, in accordance with some embodiments. Curve 511 shows a correlation between compressive stresses exerted on a substrate to measurement of Raman peak shift on the substrate. To counter higher compressive stress, a tensile film with higher stress needs to be deposited. Curve 512 shows a correlation between tensile film stress for a stress film that is deposited over devices of active pixel cell to counter the compressive stress exerted on the substrate. By depositing a stress layer with a countering stress to the stress exerted on the substrate, the dark current and white cell counts can be reduced. In the example described above, the stress exerted on the substrate before the stress layer is deposited is compressive and a countering tensile stress layer is deposited. If the stress exerted on the substrate is tensile, the tensile stress can also increase dark current and white cell counts. Under such circumstance, a stress layer with a countering compressive stress would need to be deposited to reduce the negative effect of the tensile stress in increasing dark current and white cell counts. Curves 511 and 512 shown in FIG. 5B are merely examples. Other shapes of curves that demonstrate the correlation of higher stress (compressive stress on substrate and tensile stress of stress layer) with higher Raman peak shift also apply.

Curves 511 and 512 can be established (or characterized) for substrate processing to create active pixel cells (or CIS devices) to determine how tensile the stress layer (a dielectric film) need to be to counter the compressive stress exerted on the substrate. In addition to STI creation, other substrate processing operations, such as gate dielectric deposition, etc., can introduce stress on the substrate. In some embodiments, before the tensile film is deposited, a Raman spectroscopy can be applied on the substrate to determine how much compressive stress has been introduced by substrate processing. Based on the measurement of Raman peak shift and established correlation curves, such as curves 511 and 512, a tensile film stress that counters the measured compressive stress can be identified. Based on the identified tensile stress, a particular film deposition recipe that will produce the identified tensile film stress can be selected and be used to deposit the stress layer, such as layer 401 of FIG. 4.

Figure 6A:
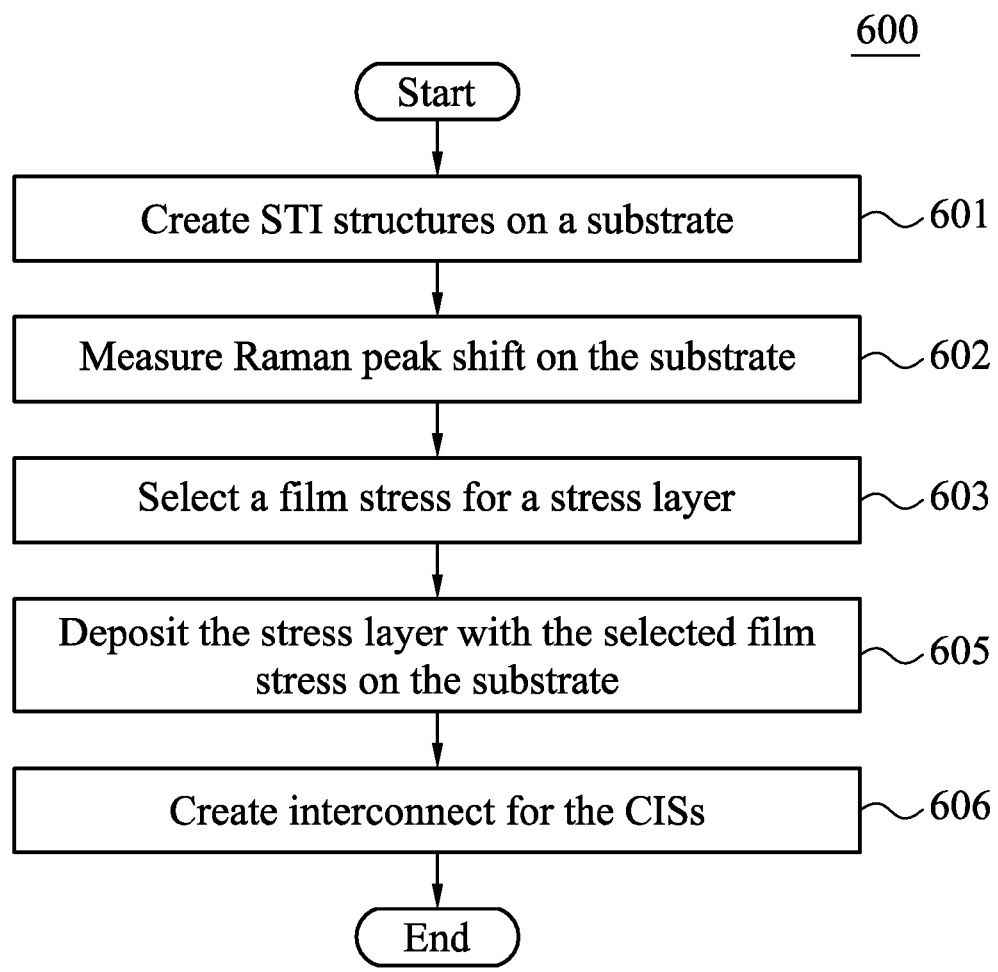
FIG. 6A shows a process flow of depositing a stress layer on a substrate with photodiode devices to reduce dark current and white cell counts of such devices, in accordance with some embodiments.

FIG. 6A shows a process flow 600 of depositing a stress layer on a substrate with photodiode devices to reduce dark current and white cell counts of such devices, in accordance with some embodiments. In some embodiments, the photodiodes are part of active pixel cells of CISs. Process flow 600 starts with operation 601 of processing a substrate to create STI structures on a substrate. In some embodiments, the process operations involved in creating STI structures are those described above in associated with FIG. 2. After operation 601, Raman spectroscopy to is used to measure peak shift on the substrate at operation 602, in accordance with some embodiments. In some embodiments, the measurement is made right after STI creation. In some other embodiments, the measurement is made after devices of active pixel cells are defined and right before the deposition of PMD (pre-metal dielectric) layer. If the measurement is made after the devices of active pixel cells are defined and right before the deposition of PMD layer, additional processing take place at operation 601 after STI structures are defined. The additional processing may include, but are not limited to, planarization(s), deposition(s), photoresist patterning(s), etching(s), implant(s), anneal(s), etc. Such additional processing operations are used to create devices and can occur either at operation 601 or 602.

Figure 6B:
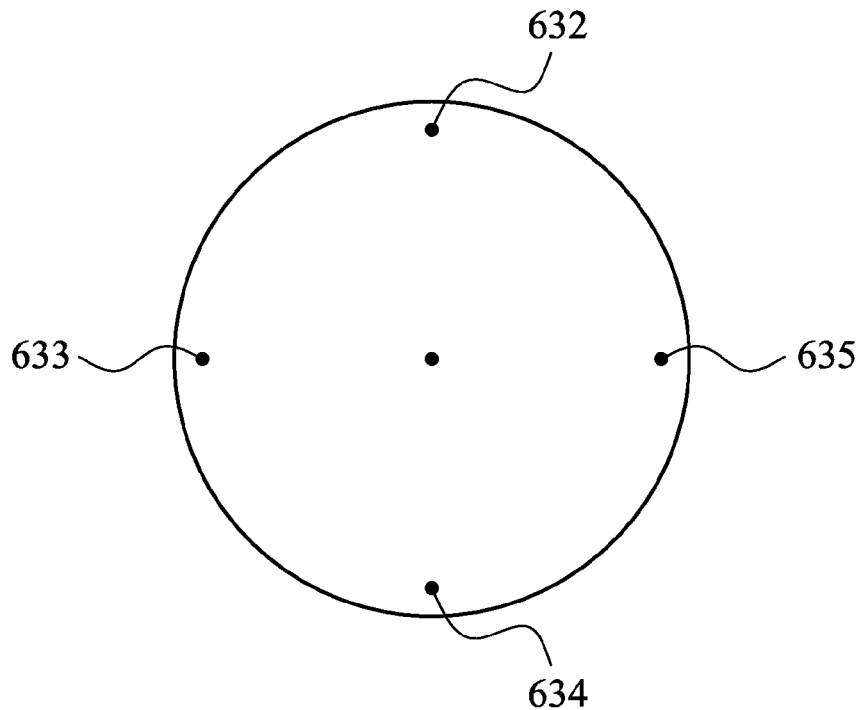
FIG. 6B shows a schematic diagram of five areas on the substrate where Peak shift data of Raman Spectroscopy are taken, in accordance with some embodiments.

In some embodiments, one of the active pixel cells includes a photodiode, a transistor(s), and an isolation structure(s). Raman spectroscopy measures the peak shift ($cm^{-1}$) of the substrate after the devices of photodiodes, transistor, and isolation structures have been prepared. In some embodiments, the scanning width of the Raman spectroscopy is about 1 μm for each data point. In some embodiments, 5 areas on the substrate have been scanned, and 40 points are scanned in each area (total width of 40 μm) to increase the accuracy of the data collected. FIG. 6B shows a schematic diagram of 5 areas (locations), areas 631, 632, 633, 634, and 635, on the substrate where Peak shift data of Raman Spectroscopy are taken, in accordance with some embodiments. Measuring Raman peak shift after the active pixel cell devices have been prepared and before the PMD deposition has the advantage of measuring the overall (or accumulated) stress impact on the substrate (including stress contribution other than STI creation), in comparison to measuring peak shift right after STI creation. As mentioned above, Raman peak shift can be correlated to stress exerted on the substrate. In addition, the film stress exerted on the substrate due to substrate processing can be compressive or tensile.

After the Raman peak shift data are collected, a film stress of a stress layer is selected based on the Raman peak shift data at operation 603. A recipe for the stress layer with the selected film stress can be created or retrieved. As described above in FIG. 5B, the film stress of the stress layer, which is used to counter the film stress exerted on the substrate by previous processing, such as STI creation and/or other processes, is correlated to the Raman peak shift. If they stress exerted on the substrate was compressive stress, the film stress of the stress layer, such as layer 401 of FIG. 4, should be tensile. On the other hand, if the stress exerted on the substrate was tensile, then the film stress of the stress layer should be compressive. The role of the stress layer is to provide a stress to counter the stress exerted on the substrate. Higher compressive stress exerted on the substrate would require a higher tensile stress from the stress layer to counter the effect of stress induced dark current and white cells. Further, as mentioned above, if the stress layer has a tensile stress and the transistors used to control the devices on active pixel cells are NMOS, there is an added benefit of higher carrier mobility and reduced time lag of transistors.

After the film stress is selected and the recipe is identified, either by process development or by retrieval, a stress layer with the selected film stress is deposited on the substrate at operation 605, in accordance with some embodiments. In some embodiments, the thickness of the stress layer is between about 50 Å to about 1000 Å. In some embodiments, the stress of the stress layer is a tensile stress in the range between about 0.1 GPA to about 2 GPa. In some other embodiments, the stress of the stress layer is a tensile stress in the range between about 0.5 GPA to about 1.5 GPa. In some embodiments, the stress layer is made of silicon nitride. In some other embodiments, the stress layer is made of a silicon nitride layer over a silicon oxide layer. The nitride stress layer could have a high tensile stress. The oxide layer can act as a stress buffer layer between the substrate and the nitride stress layer to protect the nitride layer and/or substrate from peeling from due to the tensile stress.

Figure 6C:
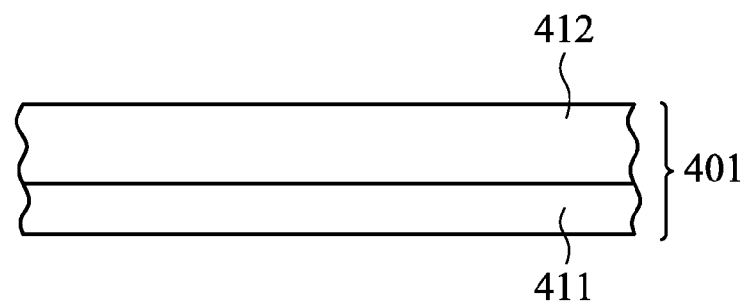
FIG. 6C shows the stress layer being made of two sub-layers, in accordance with some embodiments.

FIG. 6C shows the stress layer 401 being made of two sub-layers, 411 and 412, in accordance with some embodiments. In some embodiments, layer 411 is an oxide layer and layer 412 is a silicon nitride layer. The thickness of layer 411 is between about 50 Å to about 300 Å and layer 412 has a thickness between about 50 Å to about 1000 Å. In yet some other embodiments, the stress layer is made of silicon oxynitride or a combination of silicon oxynitride and silicon oxide.

After operation 605, the substrate undergoes additional processing to create the interconnects for the CISs at operation 606, in accordance with some embodiments. The additional processing operations may be used to form interconnect for the active pixel cell, in accordance with some embodiments. The additional processing operations may include, but are not limited to, depositing another layer of dielectric layer to complete the formation of the PMD layer, planarization, patterning, etching, metal deposition, dielectric deposition, etc., to complete the formation of interconnect and passivation. As mentioned above, the deposited stress layer would counter the stress exerted on the substrate during creating device regions on the substrate and reduce the occurrence (or magnitude) of dark current and white (pixel) cells.

The measurement of Raman peak shift on the substrate at operation 602 and selecting a film stress for a stress layer at operation 603 do not need to be performed before processing each substrate. These two operations do not need to be performed on a regular basis once the stress exerted on the substrate is identified and the recipe of the stress layer is identified. Afterwards, the substrates can be performed with the selected recipe. Therefore, operations 602 and 603 become optional during most of the substrate processing. In some embodiments, operations 602 and 603 of FIG. 6A are needed during process development for the entire process flow, when the process sequence or recipes of processing operations before the stress layer deposition is modified, or after system maintenance of systems that contributes significantly to stress exerted on the substrate before the deposition of the stress layer.

Figure 6D:
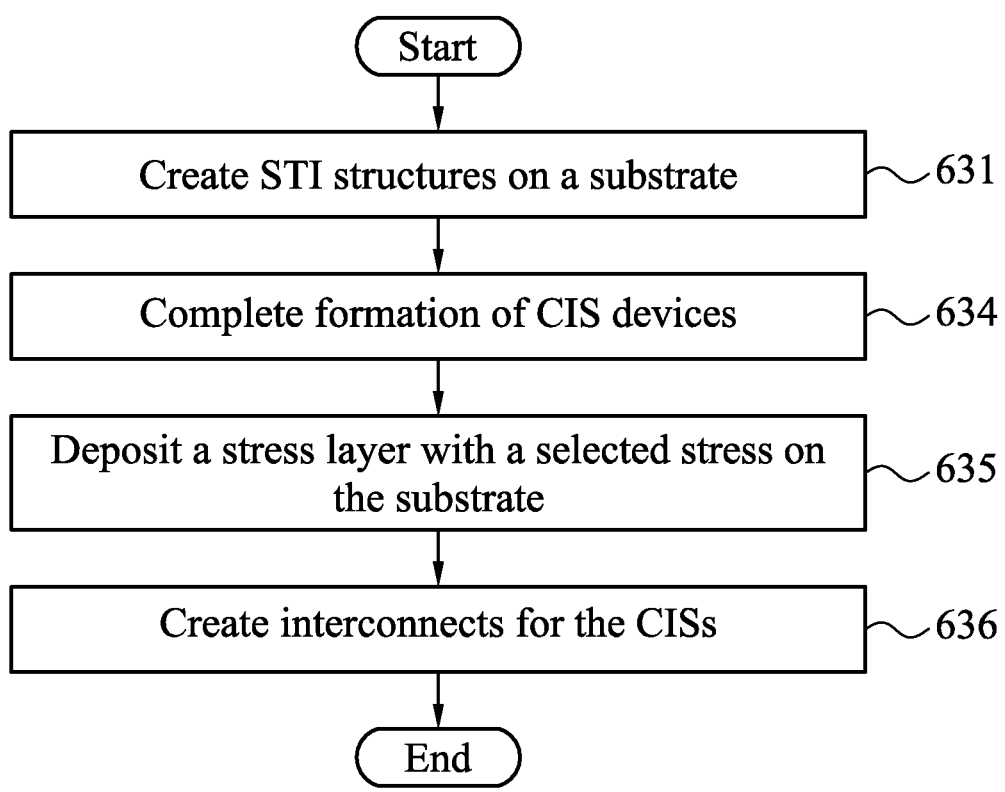
FIG. 6D shows a process flow of depositing a stress layer on a substrate with photodiode devices to reduce dark current and white cell counts of such devices, in accordance with some embodiments.

FIG. 6D shows a process flow 630 of depositing a stress layer on a substrate with photodiode devices to reduce dark current and white cell counts of such devices, in accordance with some embodiments. In some embodiments, the photodiodes are part of active pixel cells of CISs. Process flow 630 starts with operation 631, which is similar to operation 601, to create STI structures. Afterwards, at operation 634, the formation of CIS devices is completed. Operation 634 may include, but are not limited to, planarization(s), deposition(s), photoresist patterning(s), etching(s), implant(s), anneal(s), etc. After operation 634, the process flow proceeds to operation 635, which is similar to operation 605 described above. The following operation 636 is similar to operation 606 of FIG. 6A.

The active pixel cell devices described above can use frontside illumination or backside illumination. In addition, the transistors described above can be any type of transistors and are not limited to transistors with a polysilicon or amorphous silicon gate layer.

The CIS structures and methods of preparing such structures described above enable reduction of dark current and white cell counts for active pixel cells. The process of preparing active pixel cell structures introduces stress on the substrate, which could lead to increased dark current and white cell counts of active pixel cells. By depositing a stress layer as part of a pre-metal dielectric layer with a stress that counters the stress induced, both the dark current and the white cell counts can be reduced. If the transistors of the active pixel cells are NMOS, the carrier mobility can also be increased by a tensile stress layer. Raman Spectroscopy can be used to measure the stress exerted on the substrate prior to the deposition of the stress layer.

In one embodiment, an active pixel cell on a substrate is provided. The active pixel cell includes a shallow trench isolation (STI) structure, and a photodiode neighboring the STI structure. A first stress resulted from substrate processing prior to deposition of a pre-metal dielectric layer increases dark current and white cell counts of a photodiode of the active pixel cell. The active pixel cell also includes a transistor, wherein the transistor controls the operation of the active pixel cell, and a stress layer deposited over devices of the active pixel cell. The devices comprise the photodiode, the STI structure, and the transistor. The stress layer has a second stress that counters the first stress exerted on the substrate, and the second stress reduces the dark current and the white cell counts caused by the first stress.

In another embodiment, an active pixel cell on a substrate is provided. The active pixel cell includes a shallow trench isolation (STI) structure, and a photodiode neighboring the STI structure. A first stress resulted from substrate processing prior to deposition of a pre-metal dielectric layer increases dark current and white cell counts of a photodiode of the active pixel cell. The active pixel cell also includes an n-type metal-on-semiconductor (NMOS) transistor. The NMOS transistor controls the operation of the active pixel cell. The active pixel cell further includes a stress layer deposited over devices of the active pixel cell. The stress layer is part of a pre-metal dielectric layer, and the devices comprise the photodiode, the STI structure, and the NMOS transistor. The photodiode is disposed next to the STI structure, and the stress layer has a second stress that counters the first stress exerted on the substrate. The second stress reduces the dark current and the white cell counts caused by the first stress and increases the carrier mobility of the NMOS transistor.

In yet another embodiment, an active pixel cell includes a substrate. The active pixel cell further includes a shallow trench isolation (STI) structure in the substrate, where the STI structure exerts a first stress on the substrate. The active pixel cell further includes a photodiode neighboring the STI structure. The active pixel cell further includes a transistor, wherein the transistor is configured for controlling operation of the active pixel cell. The active pixel cell further includes a stress layer over the photodiode, the STI structure, and the transistor, wherein the stress layer has a second stress from about 0.1 GPa to about 2 GPa, and the second stress is opposite the first stress exerted on the substrate.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An active pixel cell on a substrate, comprising
a shallow trench isolation (STI) structure, the STI exerting a first stress on the substrate;
a photodiode neighboring the STI structure, wherein the first stress increases dark current and white cell counts of a photodiode of the active pixel cell;
a transistor, wherein the transistor controls the operation of the active pixel cell; and
a stress layer deposited over devices of the active pixel cell, wherein the devices comprises the photodiode, the STI structure, and the transistor, and wherein the stress layer is exerting a second stress on the substrate in a direction opposite to the first stress, and wherein the second stress reduces the dark current and the white cell counts caused by the first stress.

2. The active pixel cell of claim 1, wherein the photodiode is an n-type photodiode with a p-type pinning layer.

3. The active pixel cell of claim 1, wherein the active pixel cell is a 5 T, 4 T, 3 T, or 1 T cell.

4. The active pixel cell of claim 1, wherein the STI structure includes a liner dielectric layer and a gap-fill dielectric layer, and wherein both the liner dielectric layer and the gap-fill dielectric layer are located in a shallow trench of the STI structure.

5. The active pixel cell of claim 1, wherein the stress layer is selected from the group consisting of a nitride layer, an oxynitride layer, and a composite of an oxide layer and an oxynitride layer.

6. The active pixel cell of claim 1, wherein the first stress is compressive and the second stress is tensile.

7. The active pixel cell of claim 6, the transistor is an NMOS and carrier mobility of the NMOS transistor is configured to be increased due to the tensile stress of the stress layer.

8. The active pixel cell of claim 1, wherein the stress layer has a thickness between about 50 Å to about 1000 Å.

9. The active pixel cell of claim 1, wherein the stress layer is exerting a tensile stress on the substrate of about 0.1 GPa to about 2 GPa.

10. An active pixel cell on a substrate, comprising
a shallow trench isolation (STI) structure, the STI exerting a first stress on the substrate;
a photodiode neighboring the STI structure, wherein the first stress increases dark current and white cell counts of a photodiode of the active pixel cell;
an n-type metal-on-semiconductor (NMOS) transistor, wherein the NMOS transistor controls the operation of the active pixel cell; and
a stress layer deposited over devices of the active pixel cell, and wherein the stress layer is part of a pre-metal dielectric layer, and wherein the devices comprises the photodiode, the STI structure, and the NMOS transistor, and wherein the photodiode is disposed next to the STI structure, and wherein the stress layer is exerting a second stress on the substrate in a direction opposite to the first stress, and wherein the second stress reduces the dark current and the white cell counts caused by the first stress.

11. The active pixel cell of claim 10, wherein the STI structure includes a liner dielectric layer and a gap-fill dielectric layer, and wherein both the liner dielectric layer and the gap-fill dielectric layer are located in a shallow trench of the STI structure.

12. The active pixel cell of claim 10, wherein the stress layer is selected from the group consisting of a nitride layer, and an oxynitride layer.

13. The active pixel cell of claim 10, wherein the stress layer comprises an oxide layer and a silicon nitride layer over the oxide layer.

14. The active pixel cell of claim 13, wherein the oxide layer has a thickness between about 50 Å to about 300 Å.

15. The active pixel cell of claim 13, wherein the silicon nitride layer has a thickness between about 50 Å to about 300 Å.

16. The active pixel cell of claim 10, wherein the stress layer has a thickness between about 50 Å to about 1000 Å.

17. The active pixel cell of claim 10, wherein the stress layer is exerting a tensile stress on the substrate of about 0.1 GPa to about 2 GPa.

18. An active pixel cell, comprising:
a substrate;
a shallow trench isolation (STI) structure in the substrate, wherein the STI structure exerting a first stress on the substrate;
a photodiode neighboring the STI structure;
a transistor, wherein the transistor is configured for controlling operation of the active pixel cell; and
a stress layer over the photodiode, the STI structure, and the transistor, wherein the stress layer is exerting a second stress on the substrate of about 0.1 GPa to about 2 GPa, and the second stress is in a direction opposite the first stress.

19. The active pixel cell of claim 18, wherein the stress layer has a thickness between about 50 Å to about 1000 Å.

20. The active pixel cell of claim 18, wherein the stress layer is selected from the group consisting of a nitride layer, an oxynitride layer, and a composite of an oxide layer and an oxynitride layer.

* * * * *